United States Patent [19]

Scott et al.

[11] Patent Number: 5,070,381
[45] Date of Patent: Dec. 3, 1991

[54] HIGH VOLTAGE LATERAL TRANSISTOR

[75] Inventors: David B. Scott, Plano; Hiep V. Tran, Carrollton, both of Tex.

[73] Assignee: Texas Instruments Incorporated, Dallas, Tex.

[21] Appl. No.: 496,487

[22] Filed: Mar. 20, 1990

[51] Int. Cl.$^5$ .................... H01L 29/72; H01L 27/10
[52] U.S. Cl. ........................... 357/35; 357/34; 357/43
[58] Field of Search ..................... 357/34, 35, 43

[56] References Cited

U.S. PATENT DOCUMENTS

| T. 861,057 | 4/1969 | Lin | 357/35 |
| 4,264,382 | 4/1981 | Anantha et al. | 357/35 |
| 4,404,738 | 9/1983 | Sasaki et al. | 357/35 |

Primary Examiner—Jerome Jackson, Jr.
Attorney, Agent, or Firm—Douglas A. Sorensen; James T. Comfort; Melvin Sharp

[57] ABSTRACT

The described embodiments of the present invention provide a structure and method for easily incorporating a high voltage lateral bipolar transistor in an integrated circuit. A buried base contact is formed and the base itself is formed of a well region in the integrated circuit. An oppositely doped well region is formed surrounding the collector region in the lateral PNP transistor. This collector well is formed of the opposite conductivity type of the base well. Contact to the collector and a heavily doped emitter are then formed in the collector well and base well, respectively. The more lightly doped collector well provides a thick depletion region between the collector and base and thus provides higher voltage operation. The positioning of the base/collector junction to the collector well at base well junction also reduces the spacing between the collector and the emitter. This reduced spacing provides greater carrier injection from the forward biased base/emitter junction to the reverse biased base/collector junction. Thus, the performance of the lateral PNP transistor is improved. This structure is easily incorporated with standard BiCMOS processing and may be incorporated with other bipolar processing.

5 Claims, 10 Drawing Sheets

HIGH VOLTAGE LATERAL TRANSISTOR

FIELD OF THE INVENTION

The present invention relates to the field of integrated circuit design and manufacture. More specifically, the present invention relates to the field of bipolar transistor fabrication in integrated circuitry.

BACKGROUND OF THE INVENTION

Because of the small dimensions used in integrated circuitry, developing components in integrated circuitry which can withstand high voltage operation is difficult. An example is bipolar lateral transistors when incorporated with CMOS integrated circuit devices. Bipolar transistors in the same integrated circuit as complementary MOS transistors is commonly known as BiCMOS. BiCMOS fabrication processes are extremely complex and any simplification in the process or additional capability added using no additional processing steps is valuable. Lateral bipolar transistors are often included because of their ability to be easily integrated into other processes.

Lateral bipolar transistors are usually formed by using the diffusions for contacts or source/drains as collector and emitter and using a well of the opposite conductivity type as the base region. Contact to the well is provided by a buried contact region which is normally used with the higher quality vertical transistors. This process requires no additional steps to fabricate the lateral transistor and the lateral transistor can provide the opposite conductivity configuration to the vertical transistors. For example, using NPN vertical transistors, a PNP lateral transistor may be fabricated. However, the prior art configuration does not provide optimal operating characteristics. The base separation between the emitter and collector is dictated by the minimum field oxide dimensions in the integrated circuit. In addition, high voltage operation of the transistor is very limited.

SUMMARY OF THE INVENTION

The described embodiments of the present invention provide a structure and method for easily incorporating a high voltage lateral bipolar transistor in an integrated circuit. A buried base contact is formed and the base itself is formed of a well region in the integrated circuit. An oppositely doped well region is formed surrounding the collector region in the lateral PNP transistor. This collector well is formed of the opposite conductivity type of the base well. Contact to the collector and a heavily doped emitter are then formed in the collector well and base well, respectively. The more lightly doped collector well provides a thick depletion region between the collector and base and thus provides higher voltage operation. The movement of the base/collector junction to the collector well to base well junction also reduces the spacing between the collector and the emitter. This reduced spacing provides greater carrier injection from the forward biased base/emitter junction to the reverse biased base/collector junction. Thus, the performance of the lateral PNP transistor is improved. This structure is easily incorporated with standard BiCMOS processing and may be incorporated with other bipolar processing.

These and other advantages are achieved in a bipolar transistor structure, comprising: a substrate having a first conductivity type; a buried doped region having a second conductivity type opposite the first conductivity type, the buried doped region being spaced from a surface of the substrate; a first well region formed in the substrate having the first conductivity type, the first well region extending from the surface to the buried doped region; a second well region formed in the substrate having the second conductivity type, the second well region extending from the surface to the buried region and abutting the first well region; an electrical contact to the buried doped region serving as a base contact; a first doped region formed in the first well at the surface and having the first conductivity type, the first doped region serving as a collector contact; and a second doped region formed in the second well at the surface having the first conductivity type, the second doped region serving as an emitter.

In addition, the advantage above described and others achieved in a process for forming a bipolar transistor in a BiCMOS integrated circuit, comprising the steps of: providing a substrate having a first conductivity type; forming a buried doped region having a second conductivity type opposite the first conductivity type, the buried doped region being spaced from a surface of the substrate, the buried doped region formed in conjunction with the formation of other buried doped regions in the substrate; forming a first well region formed in the substrate having the first conductivity type, the first well region extending from the surface to the buried doped region, the first well region formed in conjunction with the formation of other well regions having the first conductivity type, the other well regions for the formation of other transistors therein; forming a second well region formed in the substrate having the second conductivity type, the second well region extending from the surface to the buried region and abutting the first well region, the second well region formed in conjunction with the formation of other well regions having the second conductivity type, the other well regions for the formation of other transistors therein; forming an electrical contact to the buried doped region serving as a base contact; forming a first doped region formed in the first well at the surface and having the first conductivity type, the first doped region serving as a collector contact, the first doped region being formed in conjunction with the formation of other doped regions in the substrate, the other doped regions serving as sources and drains for other transistors; and forming a second doped region formed in the second well at the surface having the first conductivity type, the second doped region serving as an emitter, the second doped region being formed in conjunction with the formation of other doped regions in the substrate, the other doped regions serving as sources and drains for other transistors.

DESCRIPTION OF THE DRAWINGS

The present invention is best understood with regard to the specific embodiments described in the following detailed description. Those specific embodiments are described in conjunction with the drawing, wherein:

FIGS. 1A through 15A are side view schematic diagrams depicting the processing steps used to fabricate bipolar and complementary MOS devices.

DETAILED DESCRIPTION

FIGS. 1A through 15A are sideview schematic diagrams depicting the processing steps necessary to fabricate a BiCMOS integrated circuit incorporating aspects of the present invention.

Figure 1A:
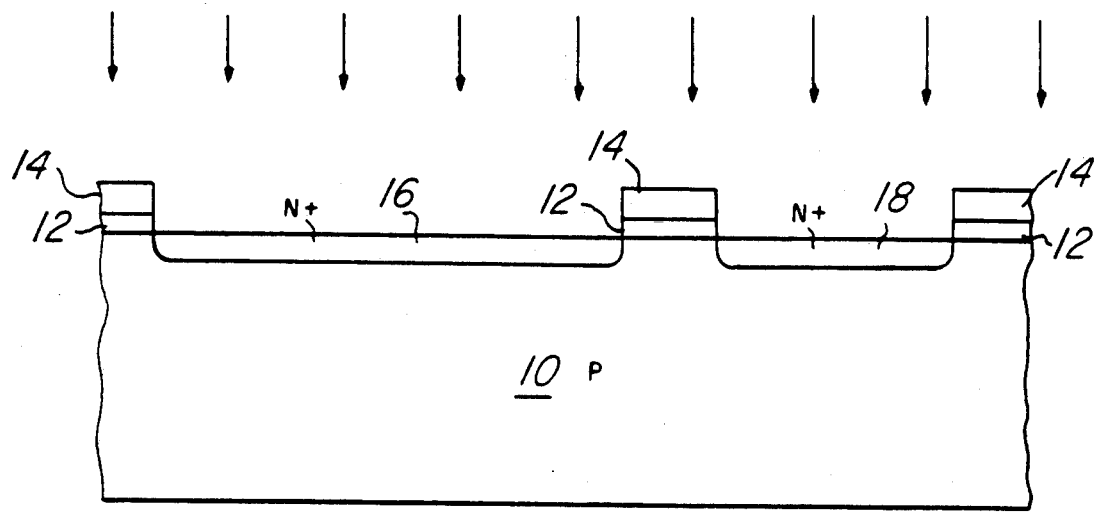
Figure 2A:
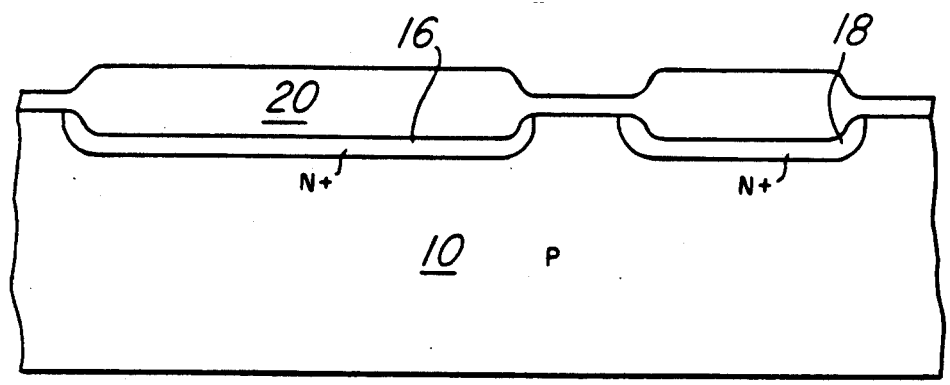

Referring to FIG. 1A, the starting material for the described fabrication processes is <100> oriented crystalline silicon doped P type to a conductivity of approximately 10 ohms-cm. This is substrate 10 as shown in FIG. 1A. A layer of silicon dioxide 12 is formed on the surface of substrate 10 by thermal oxidation in an $O_2$ ambient at a temperature of approximately 900° C. for approximately 250 minutes. Silicon dioxide layer 12 is then patterned using common photolithographic techniques to provide the structure shown in FIG. 1A. The structure of FIG. 1A is then subjected to an ion implantation of N type ions such as antimony ions having an energy of approximately 40 Kiloelectron-Volts at a density of approximately $3 \times 10^{15}$ ions/cm$^2$. This ion implantation provides N type regions 16 and 18 as shown in FIG. 1A. The structure of FIG. 1A is then subjected to thermal oxidation in a steam ambient to grow 5000 Å of silicon dioxide. This oxidation step provides silicon dioxide layer 20 as shown in FIG. 2A. In addition, N+ doped region 16 and 18 are driven into substrate 10 and annealed.

Figure 3A:
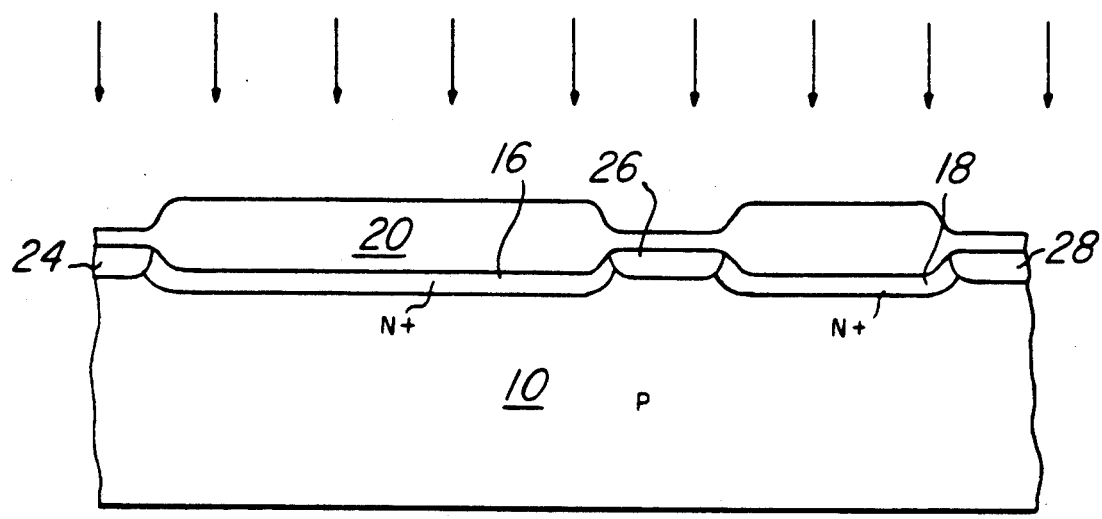
Figure 4A:
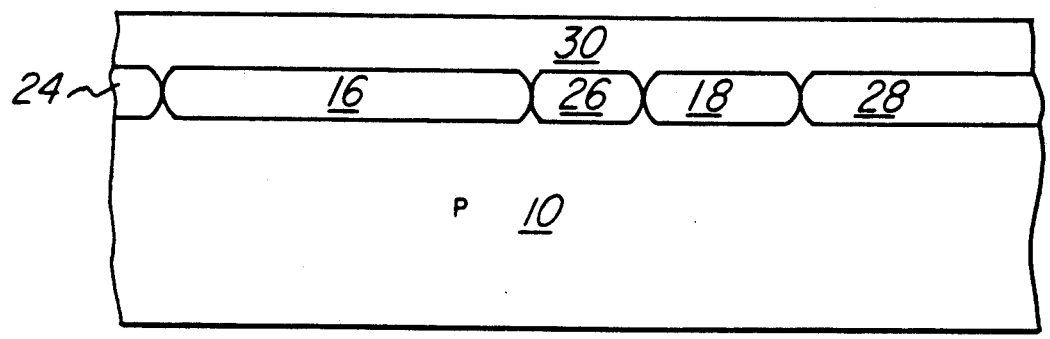
Figure 4B:
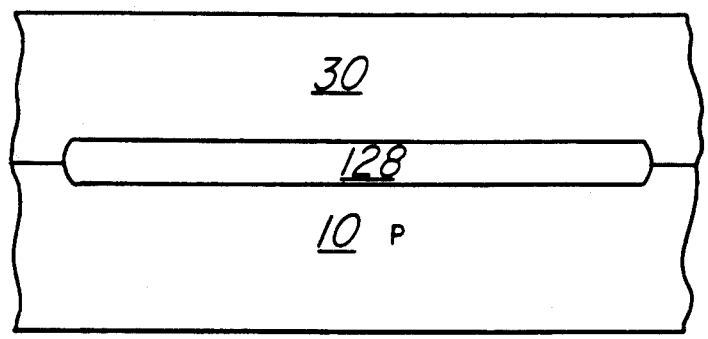
FIGS. 4B, 7B, 8B, 9B, and 15B are side view schematic diagrams depicting the processing steps necessary to fabricate the described embodiments of the present invention indicating their proper place in the process described with regard to FIGS. 1A through 15A.

Silicon dioxide layer 20 is then removed using a $HF_2$ etchant. The remaining structure, as shown in FIG. 3A is then subjected to an ion implantation of boron ions to a density of approximately $4 \times 10^{12}$ ions/cm$^2$. This ion implantation forms P regions 24, 26 and 28 as shown in FIG. 3A. The surface of the structure of FIG. 3A is planarized and an intrinsic silicon epitaxial layer 30 is then formed on the surface of substrate 10. The remaining structure is shown in FIG. 4A. Using the same steps used to fabricate the structure of FIG. 4A, the structure of FIG. 4B is fabricated including sub-base connection 128 and epitaxial layer 30.

The process for forming buried doped regions 16, 18, 24, 26, 28 and 128 providing higher planarity and an improved structure may be found in copending application Ser. No. 265,074 filed Oct. 31, 1988 and assigned to the assignee of this application. Ser. No. 265,074 is hereby incorporated by reference.

Figure 5A:
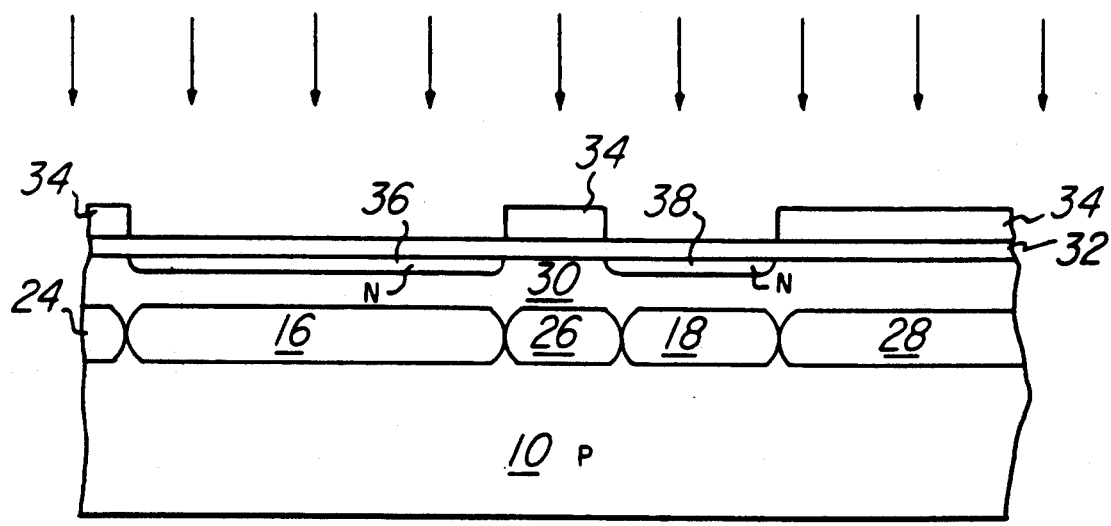

Silicon dioxide layer 32 is formed on the surface of the structure of FIG. 4A by thermal oxidation in an $O_2$ ambient for approximately 60 minutes at a temperature of approximately 900° C. This structure is shown in FIG. 5A. Silicon nitride layer 34 is then formed to a thickness of approximately 1,000 Å using low pressure chemical vapor deposition. Silicon nitride layer 34 is then patterned using common photolithographic techniques to provide the structure as shown in FIG. 5A. The structure of FIG. 5A is then subjected to an ion implantation of phosphorus ions having energies of approximately 70 and 350 Kiloelectron-Volts and both having a density of approximately $2.2 \times 10^{12}$ ions/cm$^2$. This ion implantation forms N regions 36 and 38 as shown in FIG. 5A.

Figure 6A:
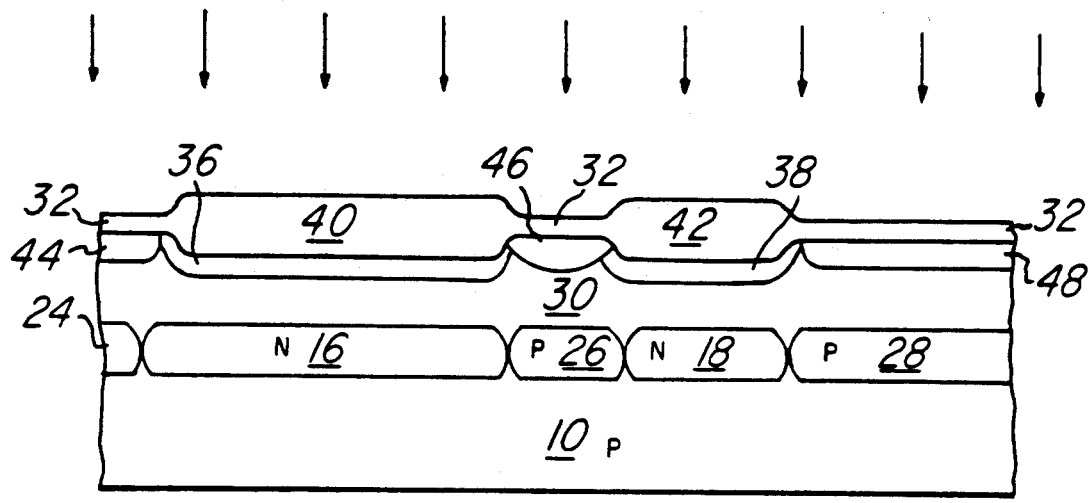
Figure 7A:
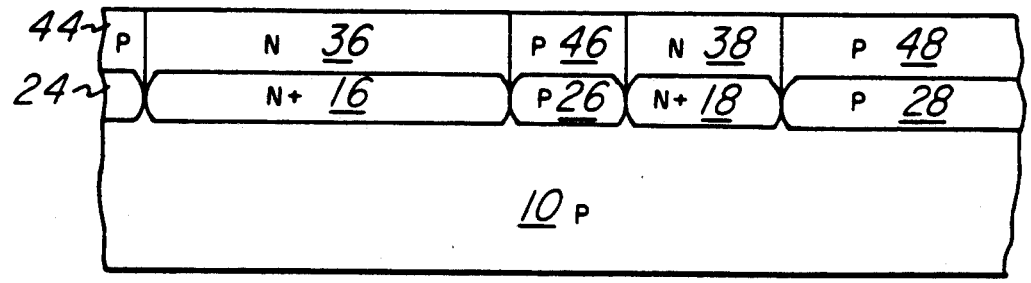
Figure 7B:
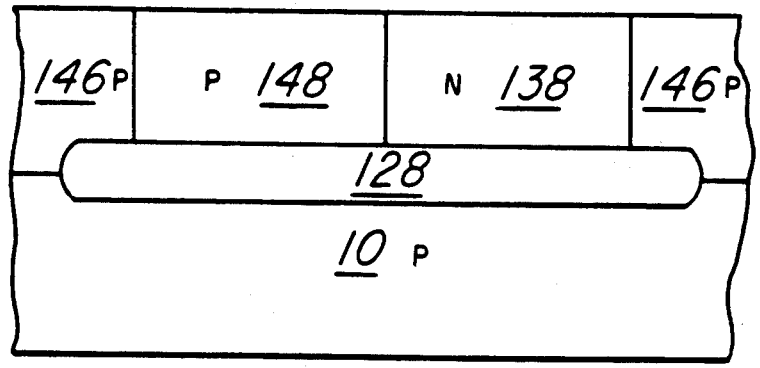

The structure of FIG. 5A is then subjected to thermal oxidation in a steam ambient for approximately 190 minutes at approximately 900° C. This forms thick silicon dioxide regions 40 and 42 as shown in FIG. 6A. The structure of FIG. 6A is then subjected to an ion implantation of boron ions having an energy of approximately 50 Kiloelectron-Volts and a density of approximately $1 \times 10^{12}$ ions/cm$^2$. This ion implantation forms P regions 44, 46 and 48 as shown in FIG. 6A. The surface of the structure of FIG. 6A is planarized and diffusions 36, 38, 44, 46, and 48 are driven in using an annealing step at a temperature of approximately 1000° C. for approximately 250 minutes in a $N_2/O_2$ ambient. The resulting structure is shown in FIG. 7A. Using the processing steps described with regard to FIG. 5A through 7A, collector well 148 and base well 138 are formed as shown in FIG. 7B. Isolation regions 146 are also formed using those steps.

Figure 8A:
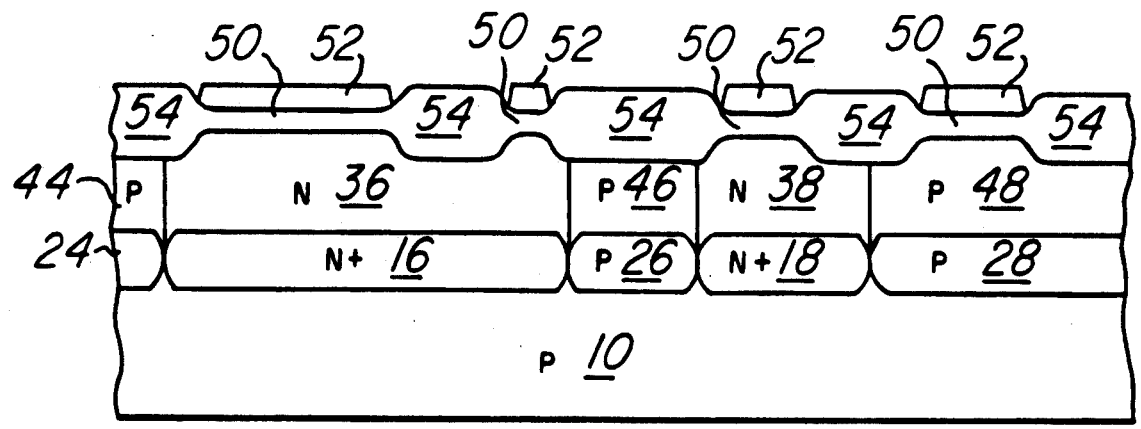
Figure 8B:
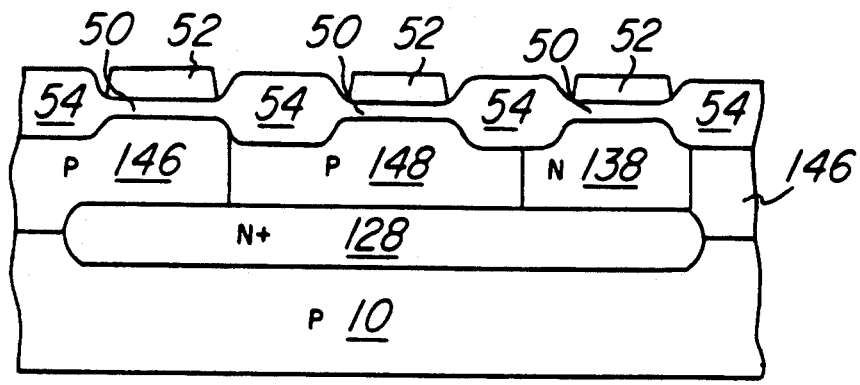

A silicon dioxide layer 50 is then thermally grown in an $O_2$ environment on the surface of the structure of FIG. 7A as shown in FIG. 8A. A layer of silicon nitride 52 is formed on the surface of silicon dioxide layer 50 and patterned to provide the structure shown in FIG. 8A. This structure is then subjected to a thermal oxidation step in a steam ambient at approximately 900° C. for approximately 500 minutes to form silicon dioxide regions 54 to a thickness of approximately 7000 Å as shown in FIG. 8A. Silicon dioxide layer 50 and thick silicon dioxide regions 54 are formed as shown in FIG. 8B using the same oxidation steps described with regard to FIG. 8A.

Figure 9A:
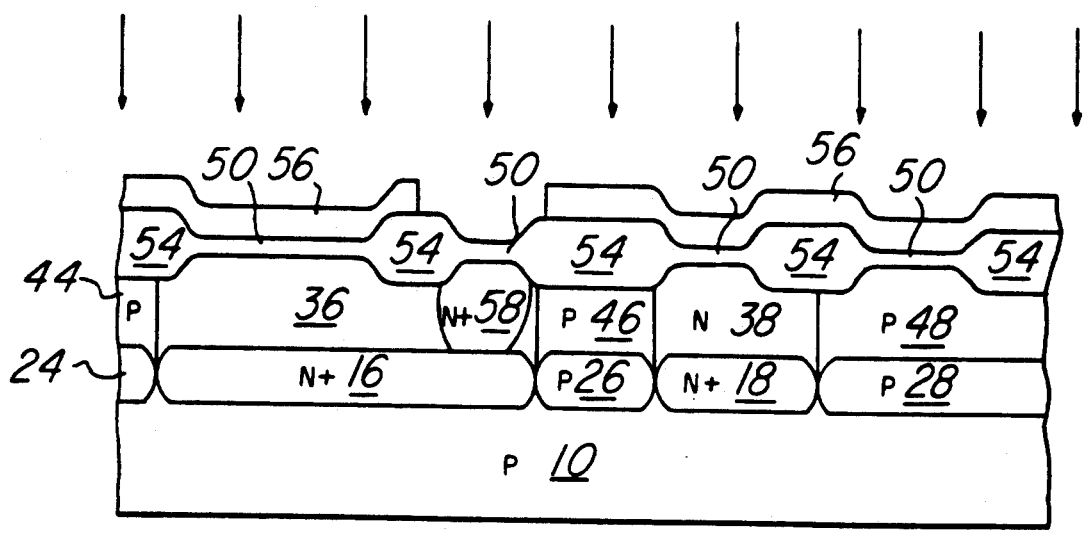
Figure 9B:
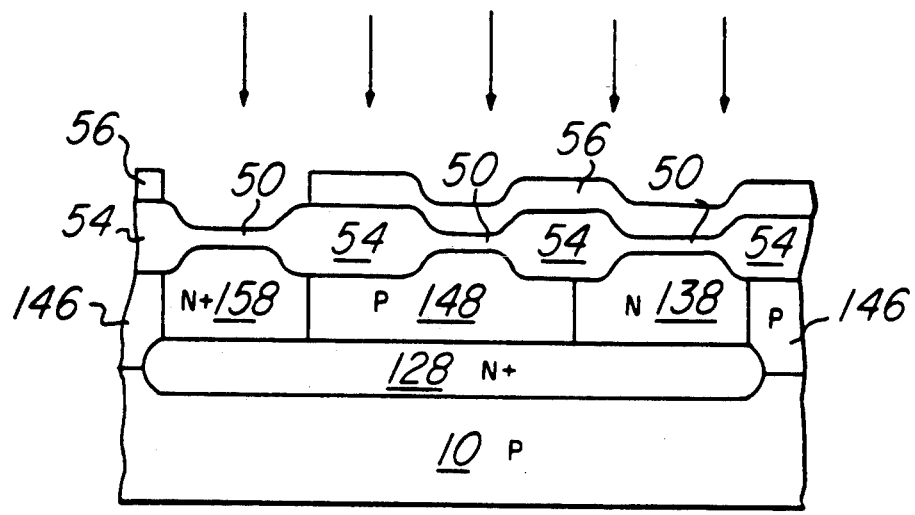

Silicon nitride layer 52 is then removed using wet chemical etching in hot phosphoric acid. A layer of photoresist 56 is then formed on the surface of the structure of FIG. 8A as shown in FIG. 9A. Photoresist layer 56 is selected to a thickness sufficient to provide a thick ion implantation mask for the implantation of phosphorus ions at an energy of approximately 300 Kiloelectron-Volts and 150 Kiloelectron-Volts, both having a density of approximately $1 \times 10^{16}$ atoms/cm$^2$. This ion implantation forms, when annealed, N+ contact region 58 as shown in FIG. 9A. Masking layer 56 is also fabricated as shown in FIG. 9B so that the ion implantation forms N+ connection 158 as shown in FIG. 9B.

Figure 10A:
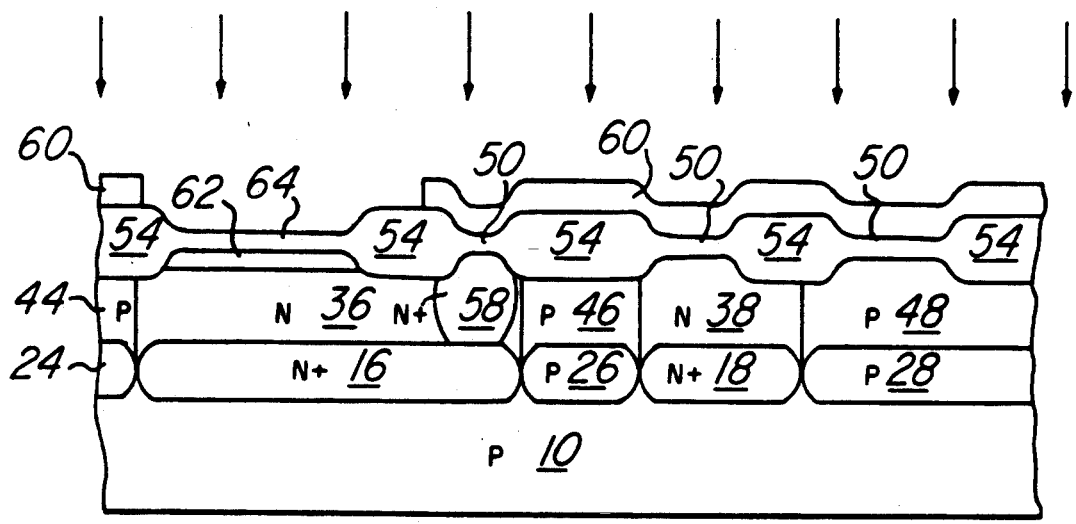
Figure 11A:
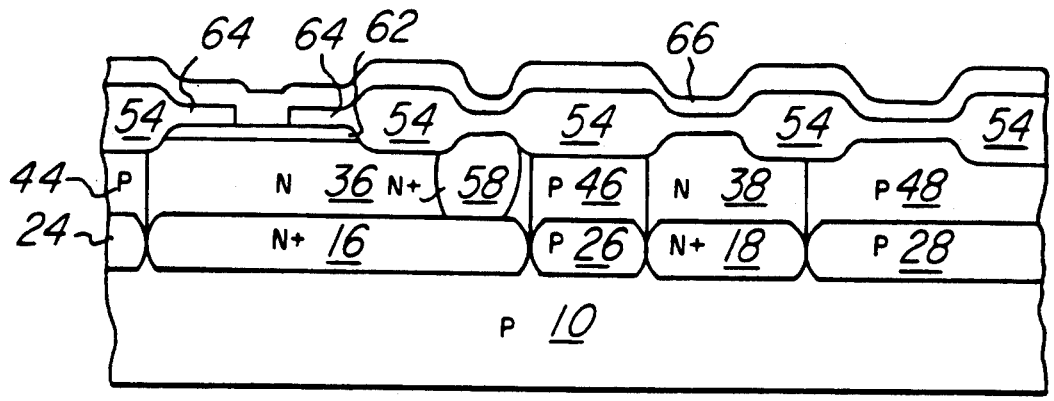

Masking layer 56 is then removed using common liquid removal techniques. Silicon nitride layer 60 is then formed on the surface of the structure of FIG. 9A as shown in FIG. 10A. Silicon nitride layer 60 is patterned and etched to expose the surface of silicon dioxide layer 50 above N well 36. Silicon dioxide layer 64 is then grown using thermal oxidation. Silicon dioxide layer 64 is grown to a thickness of approximately 1400 Å. This structure is subjected to an ion implantation of boron ions having a density of approximately $6 \times 10^{13}$ ions/cm$^2$ and an energy of approximately 40 Kiloelectron-Volts. This implantation is annealed to form P region 62 as shown in FIG. 10A.

Figure 12A:
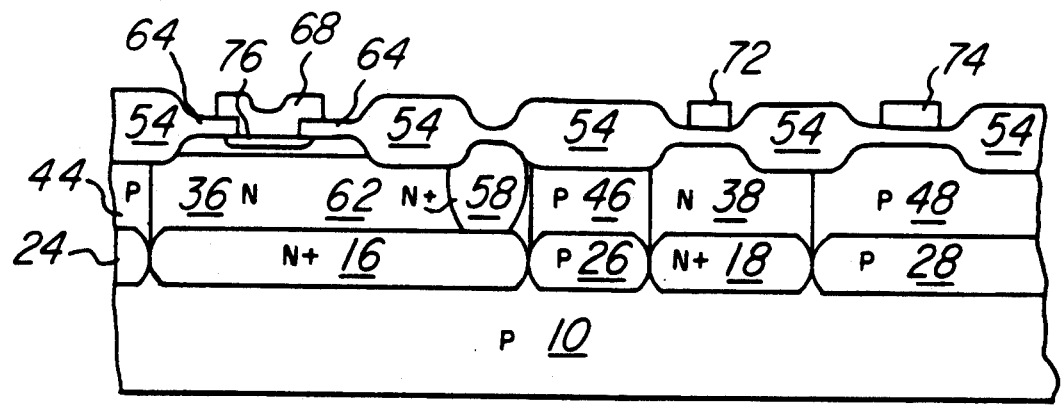

Silicon nitride layer 60 is then removed using wet chemical etching in hot phosphoric acid. A photomask (not shown) is then formed and patterned to expose a portion of the top surface of silicon dioxide layer 64. The exposed portion of silicon dioxide layer 64 is then removed using reactive ion etching. The photomask (not shown) is then removed and a layer of polycrystalline silicon 66 is formed on the surface of the structure of FIG. 11A. Polycrystalline silicon layer 66 is doped to N++ type using one of several optional techniques, such as ion implantation, in situ doping, or any other suitable technique. Polycrystalline silicon layer 66 is then patterned to provide base contact 68, gate 72 and gate 74 as shown in FIG. 12A. In the process, a portion of the doping from polycrystalline silicon layer 66 diffuses into the surface of substrate 10 at P region 62 to form N++ emitter 76.

Figure 13A:
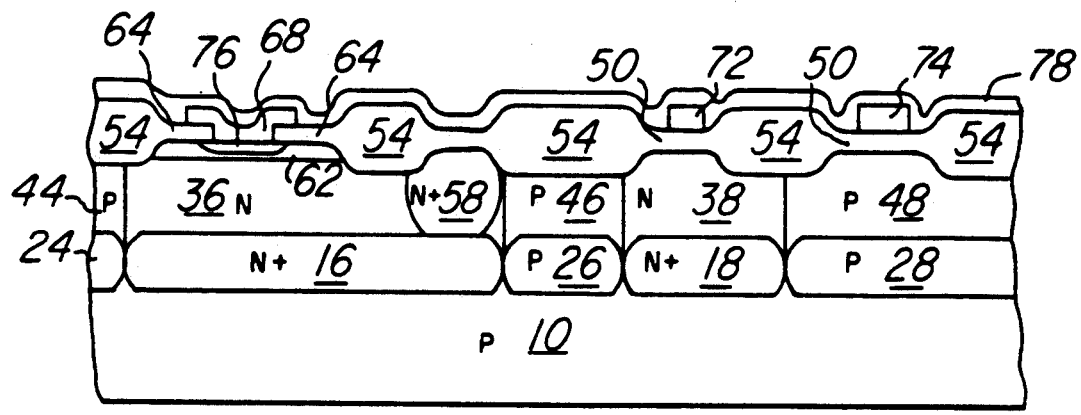
Figure 14A:
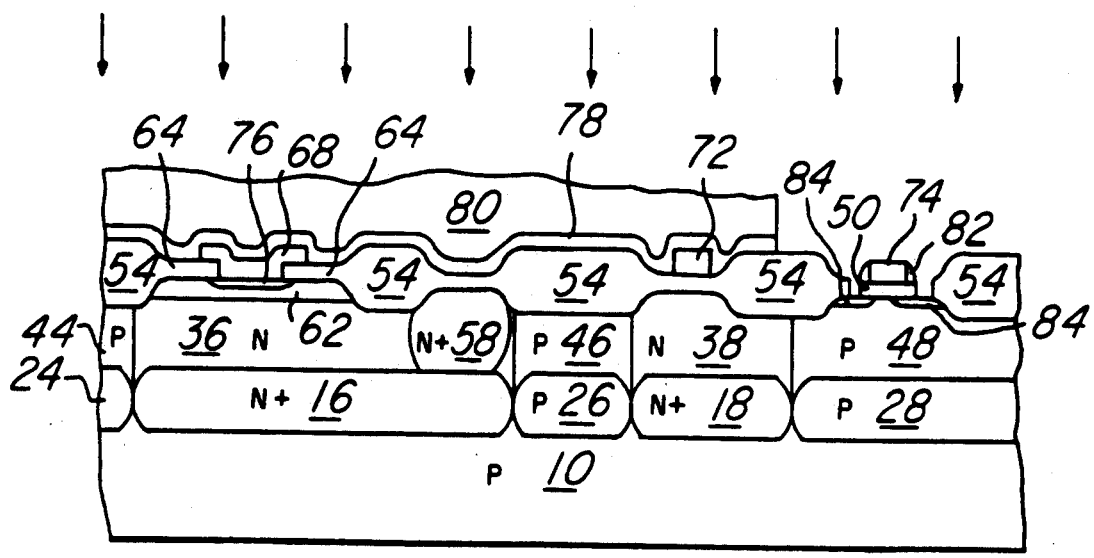

A layer of silicon dioxide 78 is then formed on the surface of the structure of FIG. 12A, as shown in FIG. 13A. A suitable etching mask 80, comprising material such as silicon nitride is formed on the surface of silicon dioxide layer 78. Etch mask 80 and silicon dioxide layer 78 are patterned and etched to expose the surface of P well 48 which is not covered by gate 74. The removal of etch mask 80 and silicon dioxide layer 78 is conducted by anisotropic etching using reactive ion etching in a $CHF_3$ etchant. Thus, a portion of silicon dioxide layer 78 will remain as sidewall silicon dioxide layers 82. An ion implantation of arsenic is then performed having an energy of 150 Kiloelectron-Volts and a density of approximately $3 \times 10^{15}$ ions/cm$^2$. This ion implantation is then annealed to form source drain regions 84, as shown in FIG. 14A.

Figure 15A:
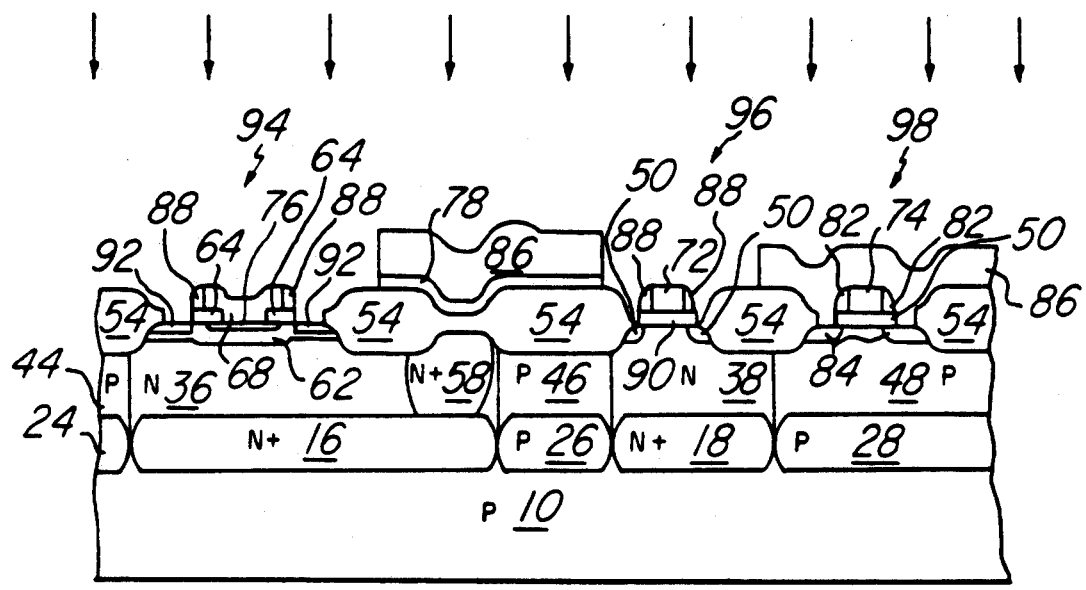
Figure 15B:
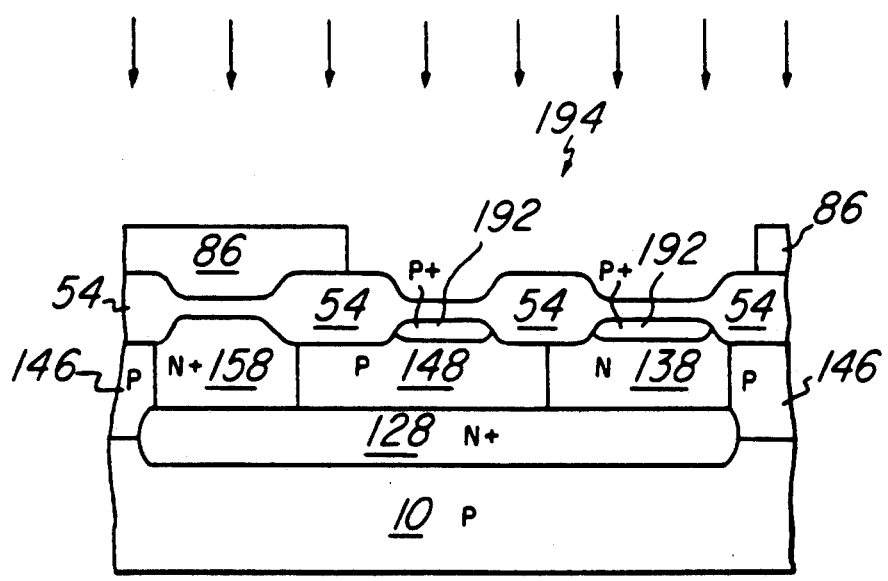

Etch mask 80 is then removed and a second etch mask 86 is formed as shown in FIG. 15A. Etch mask 86 is then patterned using common photolithographic techniques to provide the structure for etch mask 86 as shown in FIG. 15A. Etch mask 86 is then used to etch silicon dioxide layer 78 and silicon dioxide layers 50 and 64 to expose the surfaces of N wells 36 and 38 where not covered by the structure of base contact 68 and gate 72. The structure of FIG. 15A is then subjected to an ion implantation of boron ions having an energy of approximately 70 Kiloelectron-Volts and a density of approximately $3 \times 10^{15}$ ions/cm$^2$. This forms P+ source drain regions 90 and base contact regions 92 as shown in FIG. 15A. In addition, because the etching of silicon dioxide layer 78 is performed using an anisotropic process, sidewall silicon dioxide regions 88 remain on the sides of base contact 68 and gate 72.

Thus NPN transistor 94, P channel transistor 96 and N channel transistor 98 are fabricated. Additional steps such as silicidation of the surfaces of base contact 68, gates 72 and 74, source drain regions 84, source drain regions 90, and base contact regions 92 may be performed to provide better conductivity for the resulting structure.

During the processing steps described with regard to FIGS. 10A through 15A, the structure of FIG. 9B has been protected by various masking layers. Masking layer 86 is fabricated as shown in FIG. 15B to allow for ion implanatation of boron ions into the surface of collector well 148 and base well 138. This ion implantation is the same implantation described with regard to FIG. 15A and forms collector contact region 192 and emitter region 190. As with the other devices formed in the integrated circuit, additional metal layers (not shown) are used to contact base contact 158, collector contact 192 and emitter 190 to provide interconnection into other devices in the integrated circuit. Thus lateral PNP transistor 194 is formed with P+ region 190 serving as the emitter, N region 138 serving as the base and P region 148 serving as the collector. The collector/base interface is at the junction of P well 148 and N well 138. These two regions are lightly doped. Thus a reverse bias on the base/collector junction, the normal biasing arrangement, forms much thicker depletion regions than if one of the base or collector were heavily doped. This provides a higher breakdown voltage threshold than conventional structures. In addition, because the base/collector junction is closer to the base/emitter junction than in conventional lateral transistors, transistor 194 provides greater gain and higher performance. Also, transistor 194 is formed using no additional processing steps than those used to form transistors 94, 96 and 98.

Although specific embodiments of the invention are herein described, they are not to be construed as limiting the scope of the present invention. Many further embodiments of the invention will become obvious to those skilled in the art in light of the present specification. The present invention is only limited by the claims appended hereto.

What is claimed is:

1. A bipolar transistor, comprising:
   a substrate having a first conductivity type;
   a buried doped region having a second conductivity type opposite said first conductivity type, said buried doped region being spaced from a surface of said substrate;
   a first well region formed in said substrate having said first conductivity type, said first well region extending from said surface to said buried doped region;
   a second well region formed in said substrate having said second conductivity type, said second well region extending from said surface to said buried region and abutting said first well region;
   an electrical contact to said buried doped region serving as a base contact;
   a first doped region formed in said first well at said surface and having said first conductivity type, said first doped region serving as a collector contact; and
   a second doped region formed in said second well at said surface having said first conductivity type, said second doped region being substantially spaced from said buried doped region, said second doped region serving as an emitter.

2. A bipolar transistor as in claim 1 wherein said electrical contact comprises a third doped region having said second conductivity type extending from said surface to said buried doped region.

3. A bipolar transistor as in claim 1 further including a dielectric layer formed on said surface between said first and second doped region.

4. A bipolar transistor as in claim 1 wherein said first conductivity type is P and said second conductivity type is N.

5. A bipolar transistor as in claim 1 wherein said substrate comprises crystalline silicon.

* * * * *